(12) United States Patent
Gebhardt

(10) Patent No.: US 6,351,123 B1
(45) Date of Patent: Feb. 26, 2002

(54) GRADIENT COIL SYSTEM FOR A MAGNETIC RESONANCE TOMOGRAPHY APPARATUS

(75) Inventor: Matthias Gebhardt, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/342,202

(22) Filed: Jun. 29, 1999

(30) Foreign Application Priority Data

Jun. 30, 1998 (DE) .......................................... 198 29 298

(51) Int. Cl.⁷ ............................ G01V 3/00; G01R 33/20
(52) U.S. Cl. ........................................ 324/318; 324/309
(58) Field of Search ................................ 324/318, 309, 324/322, 300, 313, 314, 319

(56) References Cited

U.S. PATENT DOCUMENTS

| 5,198,769 | A | | 3/1993 | Frese et al. .................. 324/318 |
| 5,309,107 | A | | 5/1994 | Pausch ........................ 324/318 |
| 5,485,087 | A | * | 1/1996 | Morich et al. .............. 324/318 |
| 5,497,089 | A | * | 3/1996 | Lampman et al. ........... 324/318 |
| 5,512,828 | A | | 4/1996 | Pausch et al. ............... 324/309 |
| 5,574,373 | A | | 11/1996 | Pausch et al. ............... 324/318 |
| 5,581,185 | A | * | 12/1996 | Petropoulos et al. ........ 324/318 |
| 5,708,360 | A | * | 1/1998 | Yui et al. ..................... 324/318 |
| 5,939,882 | A | * | 8/1999 | Gebhardt et al. ............ 324/318 |

FOREIGN PATENT DOCUMENTS

| DE | 19534387 | * | 3/1996 |
| DE | OS 196 53 449 | | 6/1998 |
| EP | 0 672 915 | | 9/1995 |
| EP | 0 695 950 | | 2/1996 |
| JP | 8084716 | * | 3/1996 |

* cited by examiner

Primary Examiner—Hezron Williams
Assistant Examiner—Tiffany A. Fetzner
(74) Attorney, Agent, or Firm—Schiff Hardin & Waite

(57) ABSTRACT

A gradient coil system for a magnetic resonance tomography apparatus has two tesseral gradient coils arranged on a substantially cylindrical surface. A transverse gradient coil composed of a gradient coil pair projects beyond the cylindrical surface at one end in the transverse direction, with a space in the tesseral direction remaining between the individual coils of the gradient coil pair of the transverse gradient coil.

7 Claims, 5 Drawing Sheets

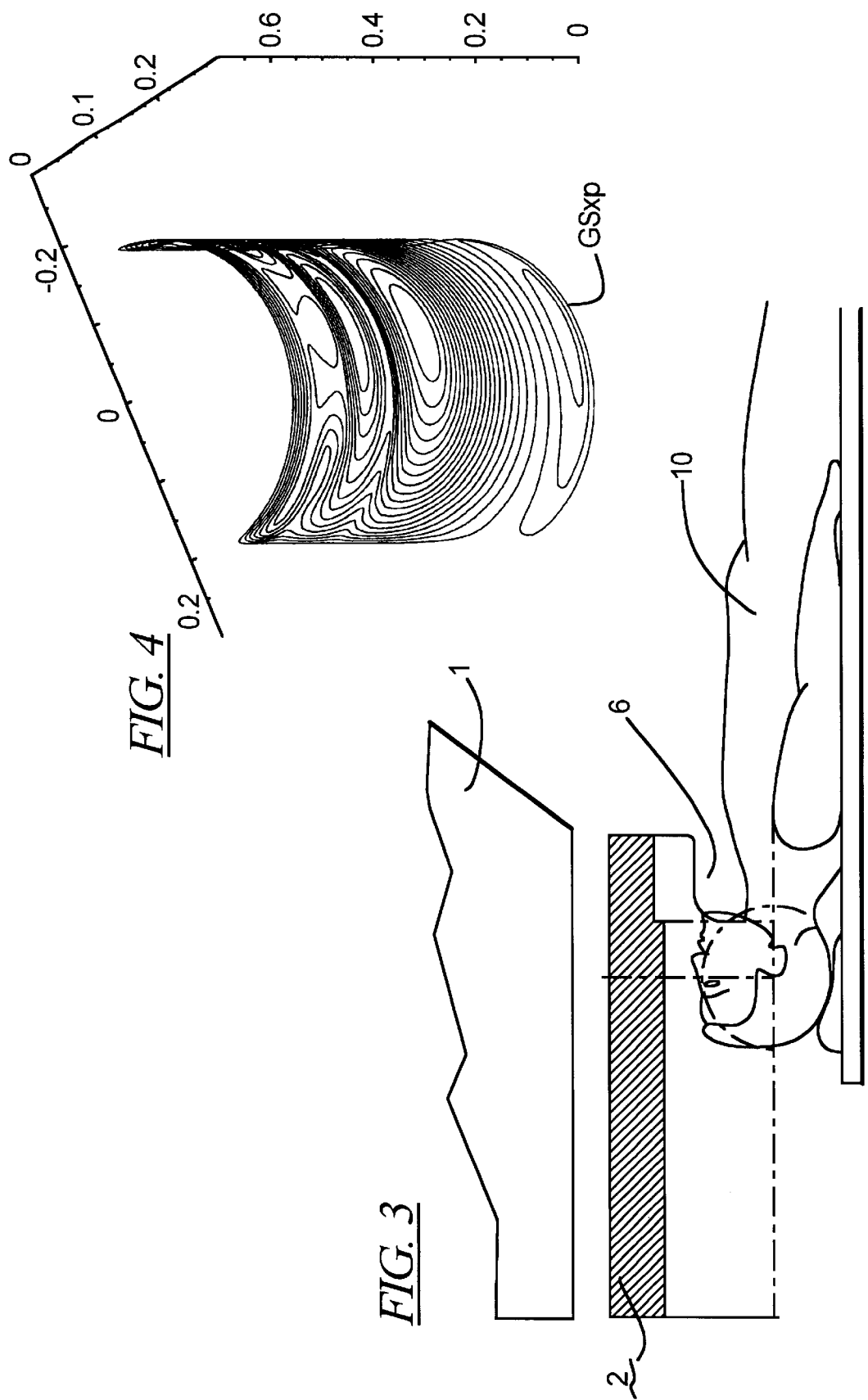

GRADIENT COIL SYSTEM FOR A MAGNETIC RESONANCE TOMOGRAPHY APPARATUS

BACKGROUND OF THE INVENTION

1. Field of the Invention

The present invention is directed to a gradient coil system for use in a magnetic resonance tomography (imaging) apparatus.

2. Description of the Prior Art

Conventional, permanently installed gradient coil systems occupy a not inconsiderable part of the interior of a magnet arrangement (called the "warm bore" given superconducting magnets). This shall be explained in greater detail with reference to FIG. 1. FIG. 1 shows the components of a conventional magnetic resonance tomography apparatus highly schematically. The basic magnetic field is generated with a magnet 1 in a toroidal coil arrangement that is usually a superconducting arrangement. Given superconducting basic field magnets, the coils (which are not shown in FIG. 1) are arranged in a cryostat. The basic field magnet has a hollow-cylindrical interior. A hollow-cylindrical gradient coil system 2 is arranged in this interior. A radio-frequency antenna is provided within the gradient coil system 2. The interior space remaining after the insulation of gradient coil system 2 and radio-frequency antenna 3 as well as after mounting cladding (not shown) is available as useful space. A patient 5 on a patient support 4 can be placed in this useful space. Certain minimum dimensions, particularly in view of the width, are required for the useful space in order to be able to examine obese patients at all or in order to be able examine patients in general without excessively serious constriction. The required inside diameter of the basic field magnet is thus established by the desired dimension of the useful space as well as by the radial expanse of the radio-frequency antenna 3 and the gradient coil system 2. The inside diameter of the basic field magnet 1, however, is a critically determining factor in the cost of the apparatus. If a larger diameter useful space is desired, not only must the toroidal coils be made larger but also, given superconducting coils, the cryostat as well be implemented with a large diameter. Due to the larger interior volume with a given magnetic field strength, more magnetic energy must also be employed. Given unchanging pre-requisites with respect to the required homogeneity in the examination space, finally, the length of the basic field magnet must also be increased together with the larger inside diameter. This is not only highly undesirable in view of costs, but also problems of claustrophobia for patients increase with greater length and the accessibility to the patient becomes poorer.

Of these systems installed in the examination space of the basic field magnet 1, the gradient coil arrangement has the highest space requirement.

It is therefore desirable to keep the outside diameter of the gradient coil system as small as possible in view of a predetermined acceptance space for the patient. Also operating in favor of a gradient coil having optimally small inside volume is that the sensitivity increases with smaller inside volume. "Sensitivity" is the ratio of generated gradient field to current to be applied given the same number of turns. Given a small inside volume, lower demands are made of the gradient amplifier with a given gradient intensity.

In order to keep the volume enclosed by the gradient coil system smaller, German OS 196 53 449 discloses that the gradient coil be fashioned, not cylindrically as usual, but opened toward both sides. The especially critical shoulder space for the patient is thus expanded, so that the inside diameter of the basic field magnet can be made smaller.

Gradient coil systems known as local gradient coil systems are available for specific applications, that only accept a part of the body of a patient, for example the head. Such a local gradient coil system is disclosed, for example, in German OS 195 04 171, corresponding to U.S. Pat. No. 5,574,373. Due to its relatively slight inductance or, respectively, high sensitivity, such local gradient coils are particularly suitable for pulse sequences wherein gradients must be switched very fast, for example for the EPI (echo planar imaging) method.

The fields of application of such local coils, however, is limited.

SUMMARY OF THE INVENTION

An object of the present invention is to provide a gradient coil system with a small inside diameter and a wide range of application.

The above object is achieved in accordance with the principles of the present invention in a gradient coil system for a magnetic resonance tomography apparatus having two tesseral gradient coils (i.e. an x-gradient coil and a y-gradient coil) that are arranged on a substantially cylindrical surface, and a transverse z-gradient coil arrangement composed of a gradient coil pair (i.e., a first z-gradient coil and a second z-gradient coil), the transverse gradient coil projecting beyond the cylindrical surface at one end in the transverse direction, and with a spacing in the tesseral direction between the individual coils of the gradient coil pair of the transverse gradient coil arrangement. Due to the projection of the transverse gradient coil beyond the cylindrical surface and due to the distance (spacing) between the individual coils of the transverse gradient coil arrangement, an expanded acceptance possibility is created for a portion of the gradient coil system. Preferably, the spacing between the individual coils of the transverse gradient coil arrangement is designed to accept the shoulders of a patient, and the inside diameter of the cylindrical surface is designed to accept the head of a patient. The neck area thus also can be accepted in a head gradient coil.

DESCRIPTION OF THE DRAWINGS

FIG. 3 is a cross-section through the upper half of the cast coil body of the inventive gradient coil system with the patient shown accepted therein, and with a schematically illustrated basic field magnet 1.

FIG. 4 shows a coil half of the primary part of a tesseral gradient coil in the inventive coil system.

DESCRIPTION OF THE PREFERRED EMBODIMENTS

Figure 1:
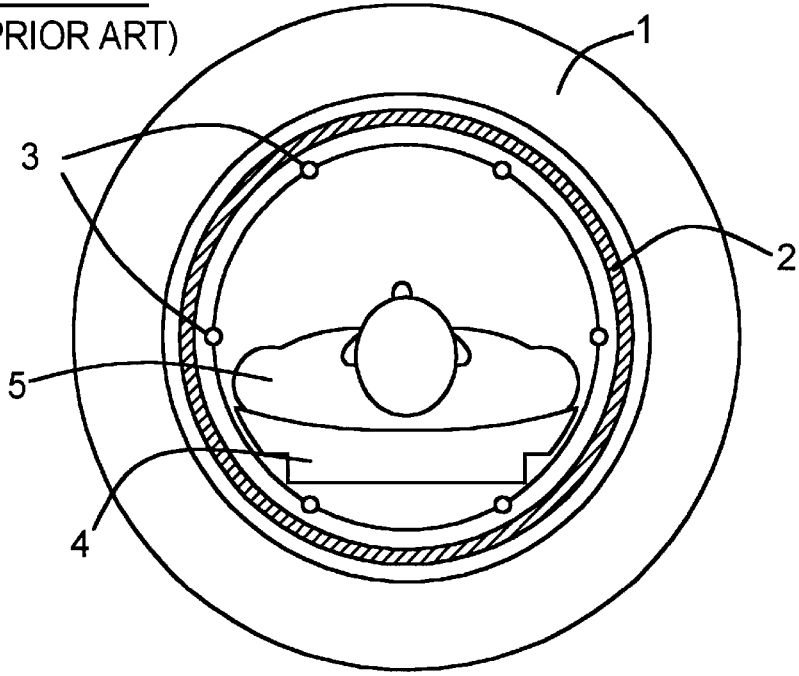
FIG. 1, as noted above, is a sectional view showing components of a conventional magnetic resonance tomography apparatus.
Figure 2:
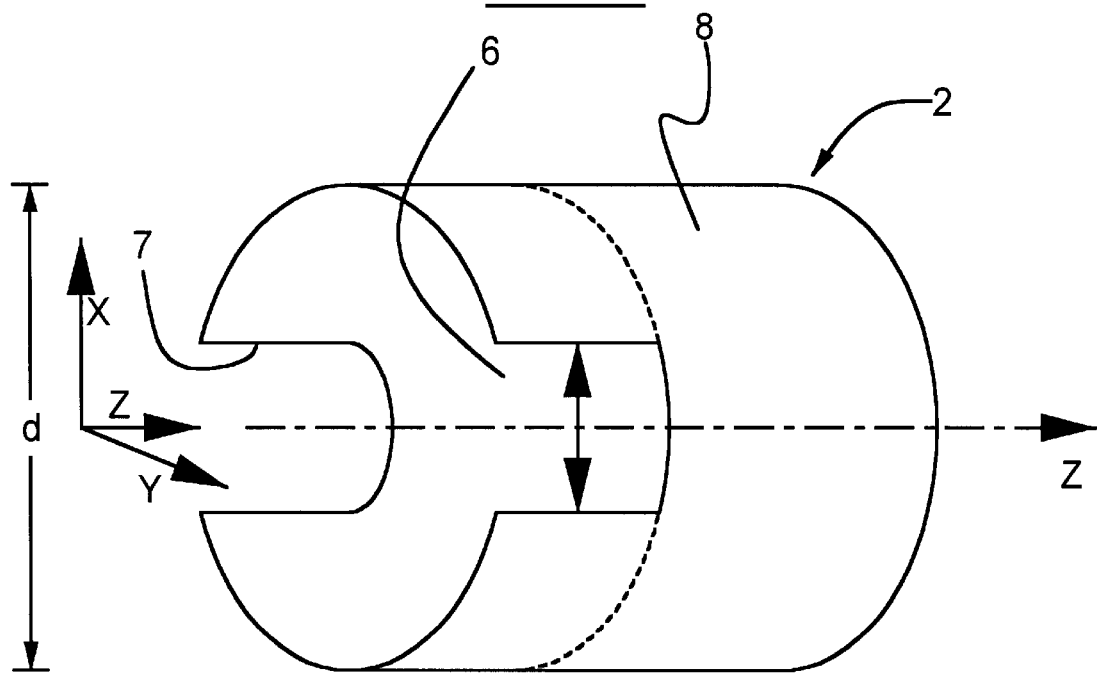
FIG. 2 schematically illustrates the geometrical contours of the inventive gradient coil system.

In the schematic illustration of FIG. 2, the geometrical structure of the inventive gradient coil system 2 is shown and it can be seen that, due to the openings 6 and 7, the coil system 2 exhibits an expanded receptacle for an examination subject compared to a purely cylindrical shape. A Cartesian coordinate system x, y, z is shown in FIG. 2. The direction z corresponds to the axis of the cylindrical surface 8 and coincides with the direction of the basic magnetic field. This direction is also referred to as the "transverse direction". A gradient lying in this direction, accordingly, is referred to as the transverse gradient; the corresponding gradient coil is referred to as the transverse gradient coil.

The directions x and y perpendicular to the z-direction are referred to as tesseral directions; the corresponding gradients are referred to as tesseral gradients; and the appertaining gradient coils are referred to as tesseral gradient coils.

In a preferred employment of the inventive gradient coil system for head examinations, the inside diameter d of the gradient coil system is dimensioned such that it is suitable for accepting the head of a patient and the radial expanse of the openings 6 and 7 is dimensioned such that these are adequate for accepting the shoulders of a patient.

FIG. 3 shows a sectional view of one-half of the cast gradient coil system 2, namely the upper half, with a patient in the examination position. It can be seen that the shoulders of the patient 10 engage into the openings 6, 7, so that the gradient coil system can be constructed clearly smaller than a conventional fully cylindrical arrangement. In the illustrated application, the gradient coil system is employed in conjunction with a specific magnet system 1 whose upper half is schematically shown in section in FIG. 3. Such a magnet system can, for example, be designed for head examinations and thus can be constructed with a significantly smaller diameter and shorter structure then conventional magnet systems.

The structure of the individual coils is shown FIGS. 3 through 9, wherein coils known as actively shielded coils are employed, with a primary coil that generates the actual useful field being surrounded by a secondary coil that shields the useful field toward the magnet side, so that disturbing eddy currents in conductive parts of the magnet structure are largely avoided. The structure and design of such actively shielded gradient coils are disclosed, for example, in U.S. Pat. No. 5,512,828.

Figure 5:
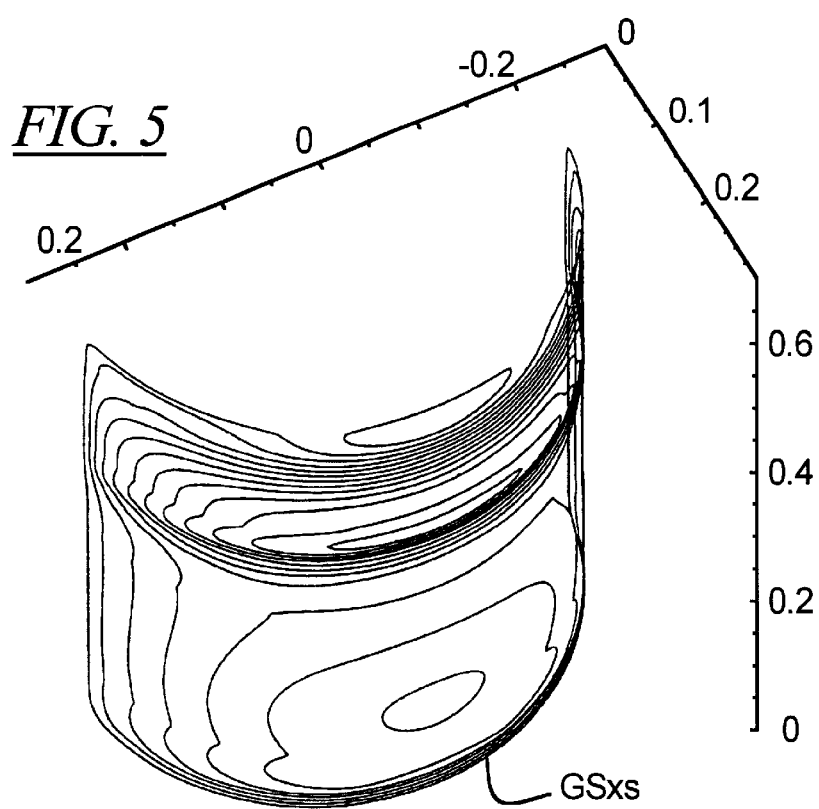
FIG. 5 shows a coil half of the secondary part of a tesseral gradient coil in the inventive coil system.

FIG. 4 shows the conductor structure for a coil half of the primary part GSxp of a tesseral gradient coil, thus, for example, of the gradient coil GSx; FIG. 5 shows the corresponding secondary coil GSxs. The second coil halves are respectively rotated symmetrically relative to the center axis of the magnet; the corresponding x-gradient coils are rotated by 90°.

It is particularly apparent when viewing FIG. 3 that the head of the patient, as the primary examination subject, does not lie in the middle of the gradient coil system. Fundamentally, however, the linear center of the gradient fields should coincide with the middle of the imaging volume. For this purpose, the tesseral gradient coils are asymmetrically designed, i.e. the linear center of the gradient coil lies offset in the direction toward the examination subject (i.e., in the z-direction) compared to the geometrical center. The design of such asymmetrical gradient coils is likewise disclosed in U.S. Pat. No. 5,512,828.

Figure 6:
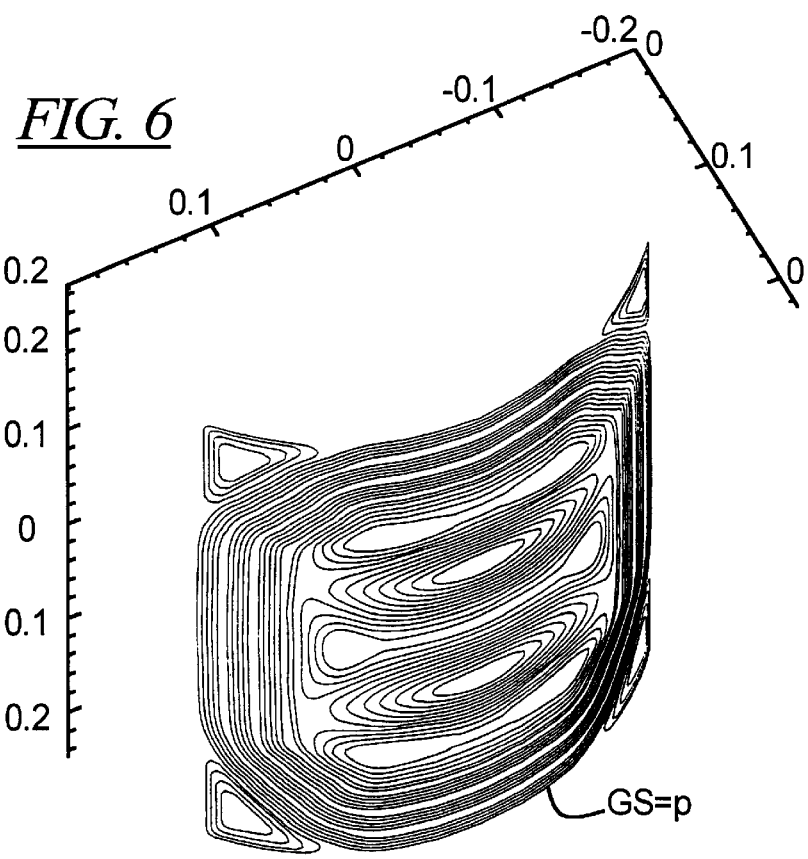
FIG. 6 shows a coil half of the primary part of a transverse gradient coil in the inventive coil system.
Figure 7:
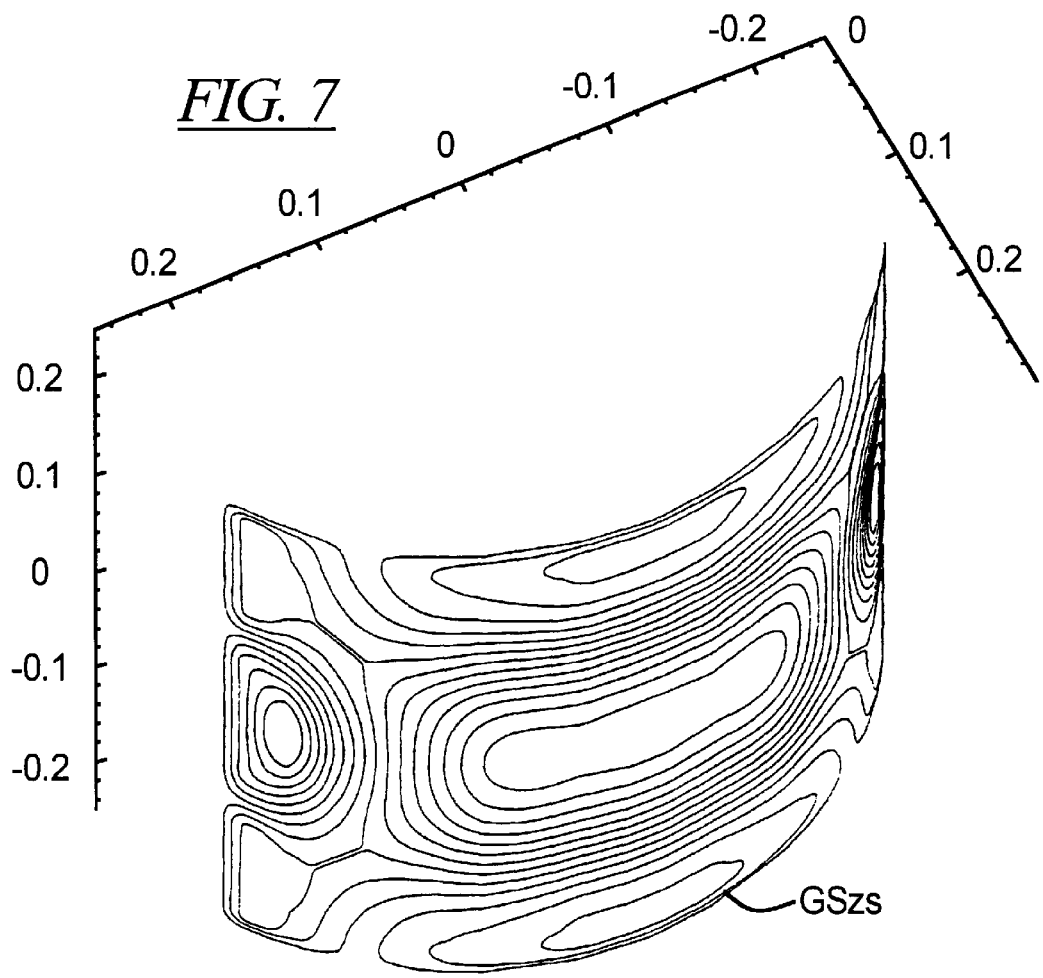
FIG. 7 shows a coil half of the secondary part of the transverse gradient coil in the inventive coil system.
Figure 8:
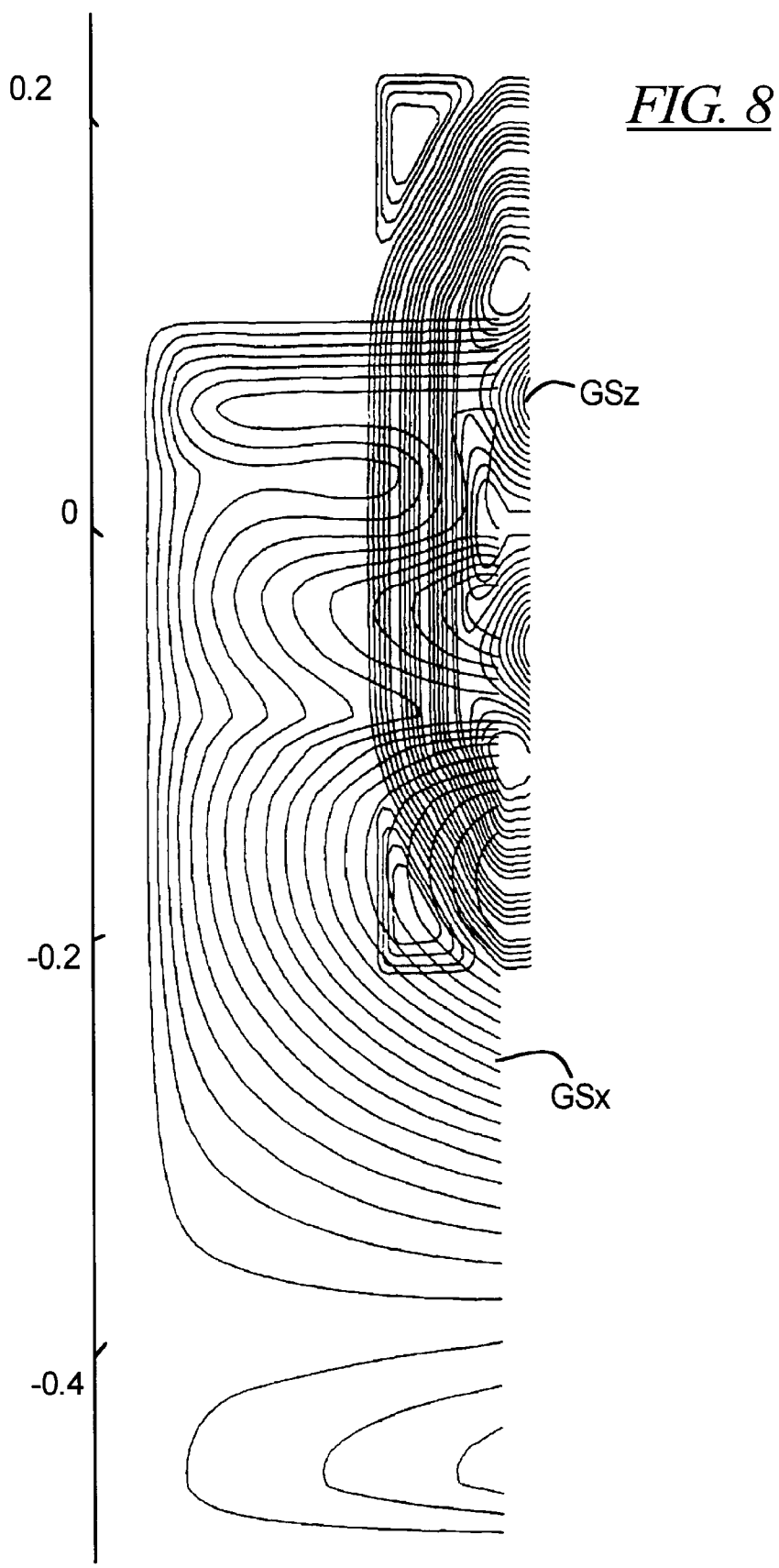
FIG. 8 shows the relative positions of the upper halves of the primary parts of a tesseral gradient coil and of the transverse gradient coil in the inventive coil system.

FIG. 6 shows a coil half of the primary part GSzp of the transverse gradient coil GSz, i.e. the z-gradient coil; FIG. 7 shows the corresponding coil half of the secondary coil GSzs. The z-gradient coil is mirror symmetrically designed. An asymmetrical design would necessarily lead to a relatively large $B_0$ boost and therefore would be unuseable for imaging. This is a consequence of the fact that a z-gradient with a zero axis crossing in the mid-point of the image represents a mirror symmetrical field distribution in the z-direction that, according to the laws of electrodynamics, can only be achieved by a conductor arrangement that is mirror symmetrical in the z-direction. For the z-gradient coil GSz, the geometrical mid-point therefore coincides with the mid-point of the imaging volume. The arrangement of the z-gradient coil GSz relative to the x-gradient coil GSx is shown in FIG. 8. One can see that the z-gradient coil GSz projects beyond the x-gradient coil GSx —or, in general, beyond the tesseral gradient coils —, with the linear centers of the asymmetrical tesseral gradient coils and of the symmetrical transverse (z-) gradient coils coinciding.

Figure 9:
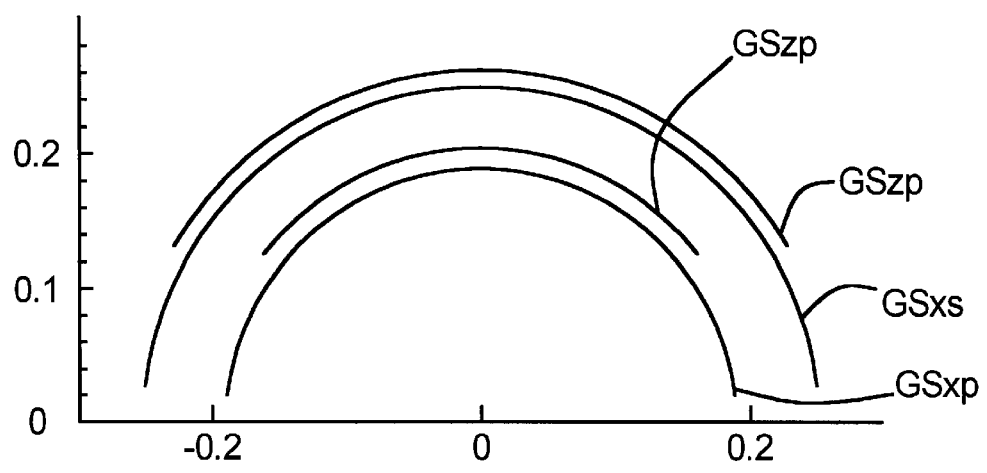
FIG. 9 shows an end view of the relative positions of the upper halves of a tesseral gradient coil and the transverse gradient coil in the inventive coil system.

FIG. 9 schematically shows the individual coil parts of the gradient coil system in a section perpendicular to the axial direction, wherein the two coil halves GSxp and GSxs of the tesseral coil GSx are shown and wherein it is again clear that the two coil halves GSzp and GSzs of the z-gradient coil GSz exhibit a distance from one another over their entire length that is suitable at one end for the acceptance of the shoulders.

With the above-described gradient coil system, the field of use of relatively small gradient coils is expanded, i.e. gradient coils that do not accept the entire body of a patient can be used. Given known head gradient coils, imaging is hardly possible in the region of the neck since, due to the collision of the patient's shoulders with the gradient coil body, the center of the imaging volume can be maximally expanded up to the middle of the head. A goal in medical diagnostics, however, is to combine the head examination with examinations of the neck/spinal column area that extends down to the bifurcation of the carotids. This is unproblematically possible with the inventive gradient coil system since, due to the recesses in the shoulder region, the head of the patient can be inserted adequately far into the gradient coil system.

The gradient coil can, for example, be utilized in the framework of a specific system for head examinations, in which case the corresponding basic field magnet need only be so large that its inside diameter just offers enough space for the shoulders. The gradient coil system, however, can also be operated as a coil known as an insert gradient coil for whole-body systems.

Since the complete cylinder surface without radial recesses is available for the tesseral gradient coils in a conventional way, these can be designed to be highly efficient. Since they only enclose an extremely small examination volume, they exhibit low inductivity, so that correspondingly reduced demands are made on the gradient amplifiers which drive the coils. Advantageously, the asymmetrical tesseral gradient coils are constructed with a torque-compensated conductor design for suppressing noise and vibrations. The calculations for constructing such gradient coils are disclosed in U.S. Pat. No. 5,309,107.

Although modifications and changes may be suggested by those skilled in the art, it is the intention of the inventor to embody within the patent warranted hereon all changes and modifications as reasonably and properly come within the scope of his contribution to the art.

I claim as my invention:

1. A gradient coil system for a magnetic resonance tomography apparatus, said gradient coil system comprising:

an x-gradient coil and a y-gradient coil disposed on a substantially cylindrical surface without recesses;

a z-gradient coil arrangement composed of a gradient coil pair comprising a first z-gradient coil and a second z-gradient coil; and said first z-gradient coil and said second z-gradient coil projecting beyond said cylindrical surface at one end of said cylindrical surface in a z-direction, with a spacing in a direction perpendicular to said z-direction between said first z-gradient coil and said second z-gradient coil.

2. A gradient coil system as claimed in claim 1 wherein each of said tesseral x-gradient coil and said y-gradient coil has a linearity center and a geometrical center, said linearity center being spaced from said geometric center in a direction in which said first z-gradient coil and said second z-gradient coil project beyond said cylindrical surface.

3. A gradient coil system as claimed in claim 2 wherein said z-gradient coil arrangement has a linearity center, and wherein the respective linearity centers of said x-gradient coil and said y-gradient coil coincide with said linear center of said gradient coil.

4. A gradient coil system as claimed in claim 1 wherein said distance between said first z-gradient coil and said second z-gradient coil is adapted to accept shoulders of a patient.

5. A gradient coil system as claimed in claim 4 wherein said cylindrical surface has an inside diameter adapted to accept a head of a patient.

6. A gradient coil system as claimed in claim 1 wherein said x-gradient, coil, said y-gradient coil, said cylindrical surface and said z-gradient coil arrangement form an insert gradient coil arrangement for a whole-body magnetic resonance apparatus.

7. A gradient coil system as claimed in claim 1 further comprising a basic field magnet having an inside diameter adapted to accept shoulders of a patient.

\* \* \* \* \*